(12) United States Patent
Tsui et al.

(10) Patent No.: US 6,952,446 B1
(45) Date of Patent: Oct. 4, 2005

(54) DIGITAL FILTER BANK FOLLOWED BY MONOBIT RECEIVERS FOR SIGNAL PROCESSING

(75) Inventors: James B. Y. Tsui, Dayton, OH (US); Scott M. Rodrigue, Beavercreek, OH (US); Anthony W. White, New Carlisle, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 777 days.

(21) Appl. No.: 10/008,476

(22) Filed: Dec. 10, 2001

(51) Int. Cl.$^7$ .............................. H03H 7/30
(52) U.S. Cl. ................ 375/232; 375/349; 375/350; 708/313; 708/322
(58) Field of Search .................. 375/229, 230, 375/232, 235, 349, 350; 708/300, 313, 315, 708/322

(56) References Cited

U.S. PATENT DOCUMENTS

| | | | |
|---|---|---|---|
| 4,547,727 A | 10/1985 | Tsui et al. | 324/79 |
| 5,499,391 A | 3/1996 | Tsui | 455/226.2 |
| 5,590,150 A | 12/1996 | Ogushi et al. | 373/9 |
| 5,917,737 A | 6/1999 | Tsui et al. | 364/726.01 |
| 5,943,642 A | 8/1999 | Choi | 702/197 |
| 5,963,164 A | 10/1999 | Tsui et al. | 342/196 |
| 6,018,754 A | 1/2000 | Chen et al. | 708/316 |

*Primary Examiner*—Dac V. Ha
(74) *Attorney, Agent, or Firm*—AFMCLO/JAZ; Gina S. Tollefson; Gerald B. Hollins (57) ABSTRACT

The present invention uses narrow-band monobit receivers after a digital filter bank to separate simultaneous signals in one channel. The invention improves the capability of wideband digital receivers.

18 Claims, 13 Drawing Sheets

DIGITAL FILTER BANK FOLLOWED BY MONOBIT RECEIVERS FOR SIGNAL PROCESSING

RIGHTS OF THE GOVERNMENT

The invention described herein may be manufactured and used by or for the Government of the United States for all governmental purposes without the payment of any royalty.

BACKGROUND OF THE INVENTION

Modern analog-to-digital converters (ADCs) used in radio frequency receiver applications can operate at very high speeds, such as at 3 GHz. However, the fast Fourier transform chip, based on a complex transformation principle, following many known ADCs in digital signal receiver applications, cannot operate at such high speeds due to the complexity of computing the number of sample points examined. The conventional approach to building a wideband digital receiver is to use a polyphase filter to slow down the operation speed of the fast Fourier transform. A specific example to illustrate using a polyphase filter to slow down operation of the fast Fourier transform follows.

The ADC used in this example operates at 3 GHz with 8 bits. A fast Fourier transform is performed on 256 points of digitized data. This fast Fourier transform operation can be written can be written as $$X(k) = \sum_{n=0}^{N-1} x(n) e^{-\frac{j2\pi kn}{N}} \quad (1)$$

where x(n) is the digitized input data and N=256. If the output frequency is decimated by 8, k= 0, 8, 16, . . . 248 are kept. That is, there are a total of 32 (256/8) outputs. The result from Eq. 1 can be written as $$X(0) = \sum_{n=0}^{255} x(n) \quad (2)$$

$$X(8) = \sum_{n=0}^{255} x(n) e^{-\frac{j2\pi 8n}{256}}$$

$$X(16) = \sum_{n=0}^{255} x(n) e^{-\frac{j2\pi 16n}{256}}$$

$$\ldots$$

$$X(248) = \sum_{n=0}^{255} x(n) e^{-\frac{j2\pi 248n}{256}}$$

First, arbitrarily consider two frequency components k=16 and k=248 and rewrite them in slightly different form. The results are $$X(16) = \sum_{n=0}^{255} x(n) e^{-\frac{j2\pi 16n}{256}} = \sum_{n=0}^{255} x(n) e^{-\frac{j2\pi n}{32}} \quad (3)$$

$$= [x(0) + x(32) + x(64) + \cdots + x(224)] +$$

$$[x(1) + x(33) + x(65) + \cdots + x(225)] e^{-\frac{j2\pi 2}{32}} +$$

$$[x(2) + x(34) + x(66) + \cdots + x(226)] e^{-\frac{j2\pi 2 \times 2}{32}} + \cdots +$$

$$[x(31) + x(63) + x(95) + \cdots + x(255)] e^{-\frac{j2\pi 2 \times 31}{32}}$$

and $$X(248) = \sum_{n=0}^{255} x(n) e^{-\frac{j2\pi 248n}{256}} = \sum_{n=0}^{255} x(n) e^{-\frac{j2\pi 31n}{32}} \quad (4)$$

$$= [x(0) + x(32) + x(64) + \cdots + x(224)] +$$

$$[x(1) + x(33) + x(65) + \cdots + x(225)] e^{-\frac{j2\pi 31}{32}} +$$

$$[x(2) + x(34) + x(66) + \cdots + x(226)] e^{-\frac{j2\pi 31 \times 2}{32}} + \cdots +$$

$$[x(31) + x(63) + x(95) + \cdots + x(255)] e^{-\frac{j2\pi 31 \times 31}{32}}$$

Figure 1:
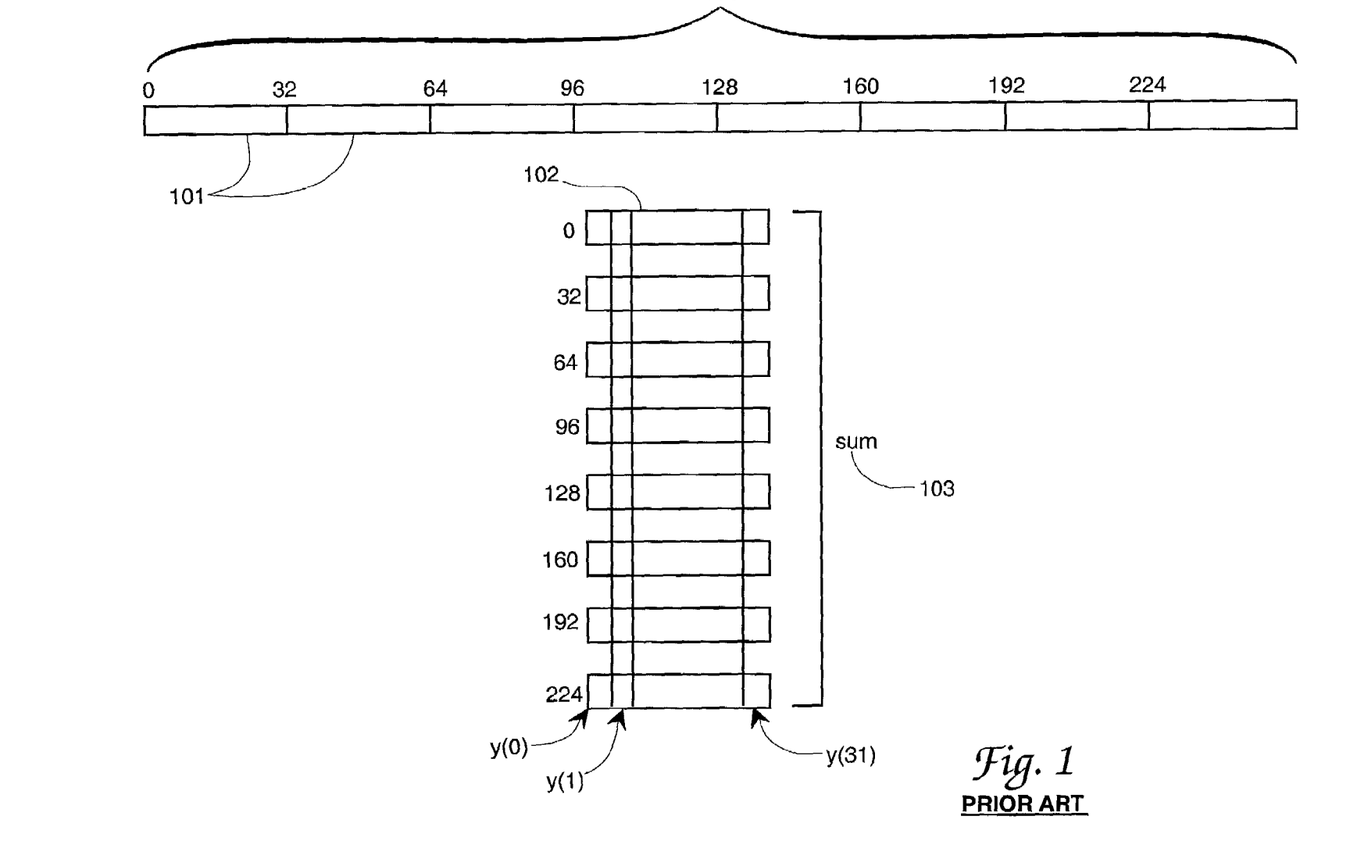
FIG. 1 is a graphical representation of obtaining y values.

In the above equations the relation of $e^{-j2\pi n}=1$ when n=integer is used. Now consider a new quantity, y(n) as $$y(n) = x(n) + x(n+32) + x(n+64) + \cdots + x(n+224) \quad (5)$$

$$= \sum_{m=0}^{7} x(n + 32m)$$

where n=0 to 31. The quantity y(n) represents the values in the bracket of Eqs (3) and (4). Each y value contains a total of 8 data points. This operation is graphically represented in FIG. 1. In FIG. 1, the 256 input data points shown at 100 are divided into eight 32-point sections, two of which are shown at 101. The beginning data point of each section is shown. These eight sections are shown stacked at 102 and summed vertically as shown at 103. The results are the 32 y(n) values.

Using these y(n) values, the results from Eq. (2) can be rewritten as $$X(0) = \sum_{n=0}^{31} y(n) \quad (6)$$

$$X(8) = y(0) + y(1)e^{-\frac{j2\pi}{32}} + y(2)e^{-\frac{j2\pi 2}{32}} + \cdots + y(31)e^{-\frac{j2\pi 31}{32}}$$

$$= \sum_{n=0}^{31} y(n) e^{-\frac{j2\pi n}{32}}$$

$$X(16) = y(0) + y(1)e^{-\frac{j2\pi 2}{32}} + y(2)e^{-\frac{j2\pi 2 \times 2}{32}} + \cdots + y(31)e^{-\frac{j2\pi 2 \times 31}{32}}$$

$$= \sum_{n=0}^{31} y(n) e^{-\frac{j2\pi 2n}{32}}$$

$$\ldots$$

$$X(248) = y(0) + y(1)e^{-\frac{j2\pi 31}{32}} + y(2)e^{-\frac{j2\pi 31 \times 2}{32}} + \cdots + y(31)e^{-\frac{j2\pi 31 \times 31}{32}}$$

$$= \sum_{n=0}^{31} y(n) e^{-\frac{j2\pi 31n}{32}}$$

All these equations can be written into one as $$X(8k) = \sum_{n=0}^{31} y(n) e^{\frac{-j2\pi kn}{32}} \quad (7)$$

where k=0, 1, 2, ..., 31; and n=0, 1, 2, ..., 31.

The output X(8k) can be relabeled as Y(k), thus, Eq. 7 can be written as $$Y(k) = \sum_{n=0}^{31} y(n) e^{\frac{-j2\pi kn}{32}} \quad (8)$$

Equation 8 represents a 32-point fast Fourier transform. In order to obtain the outputs of a 256-point fast Fourier transform decimated by 8 on the output, a 32-point fast Fourier transform can achieve the goal. Thus, the design of the fast Fourier transform can be simplified. However, the input signal must be manipulated in order to obtain the desired result.

Further, consider that if one wants to perform an N-point fast Fourier transform and the outputs in the frequency domain are decimated by M, one can achieve the goal by performing a N/M point fast Fourier transform. For this example, a new input format y(n) must be built first. The generalization of the y(n) can be written as $$y(n) = \sum_{m=0}^{M-1} x(n + mN/M) \quad (9)$$

where n=0, 1, 2, ... (N/M)−1. The outputs in the frequency domain can be obtained as $$X(k) = \sum_{n=0}^{(N/M)-1} y(n) e^{\frac{-j2\pi kn}{N/M}} \quad (10)$$

This illustrates that when the fast Fourier transform outputs are decimated by M, the outputs can be obtained from N/M point fast Fourier transform. This allows the design of a fast Fourier transform chip to be simplified tremendously.

Figure 2:
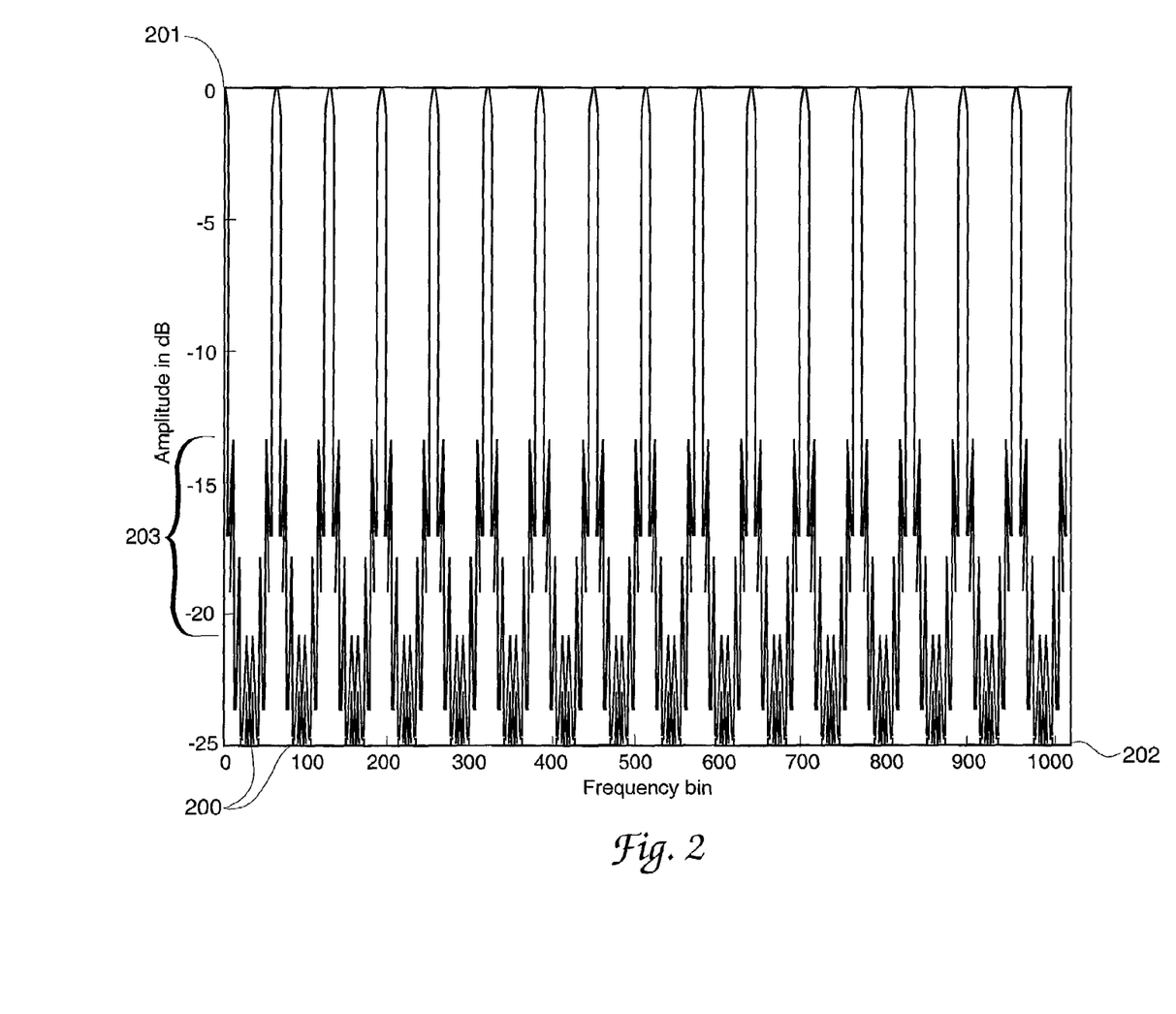
FIG. 2 shows outputs from decimated outputs with rectangular window.

If the fast Fourier transform uses 256 data points but only every one-eighth of the outputs are kept, there are a total of 32 outputs, and 16 of them carry redundant information. Therefore, only 16 outputs are displayed in FIG. 2. In FIG. 2, the y-axis at 201 represents amplitude in decibels and the x-axis represents frequency. Each filter output is represented by a sinc function, two of which are shown at 200. Only a few side lobes are shown in FIG. 2 and the highest two are only 13 dB below the main lobe, shown at 203. This filter bank has many holes. If an input signal falls in one of the holes, the receiver will miss it entirely. The shape of this filter is definitely unacceptable.

Figure 3A:
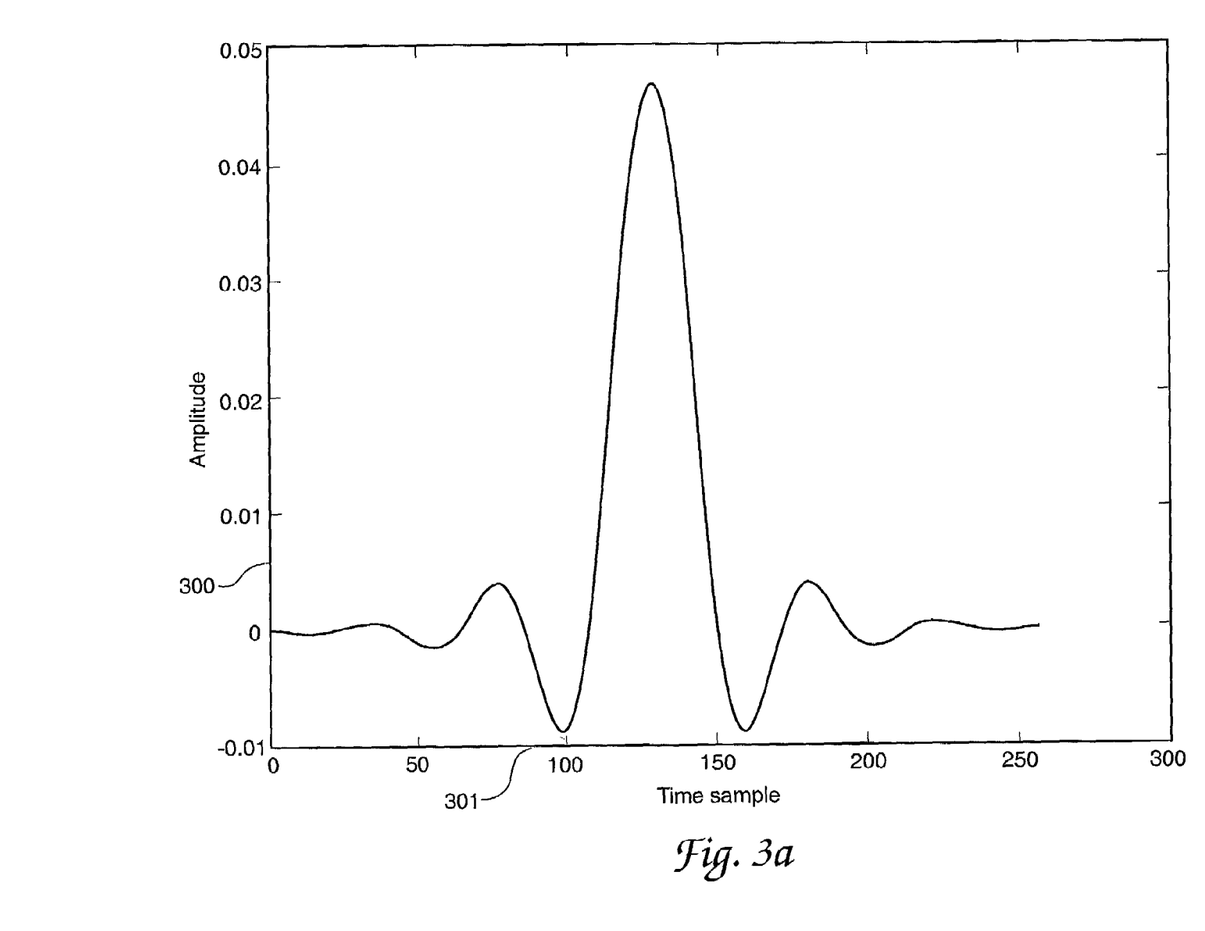
FIG. 3a shows a time domain response of a Parks-McClellan window.
Figure 3B:
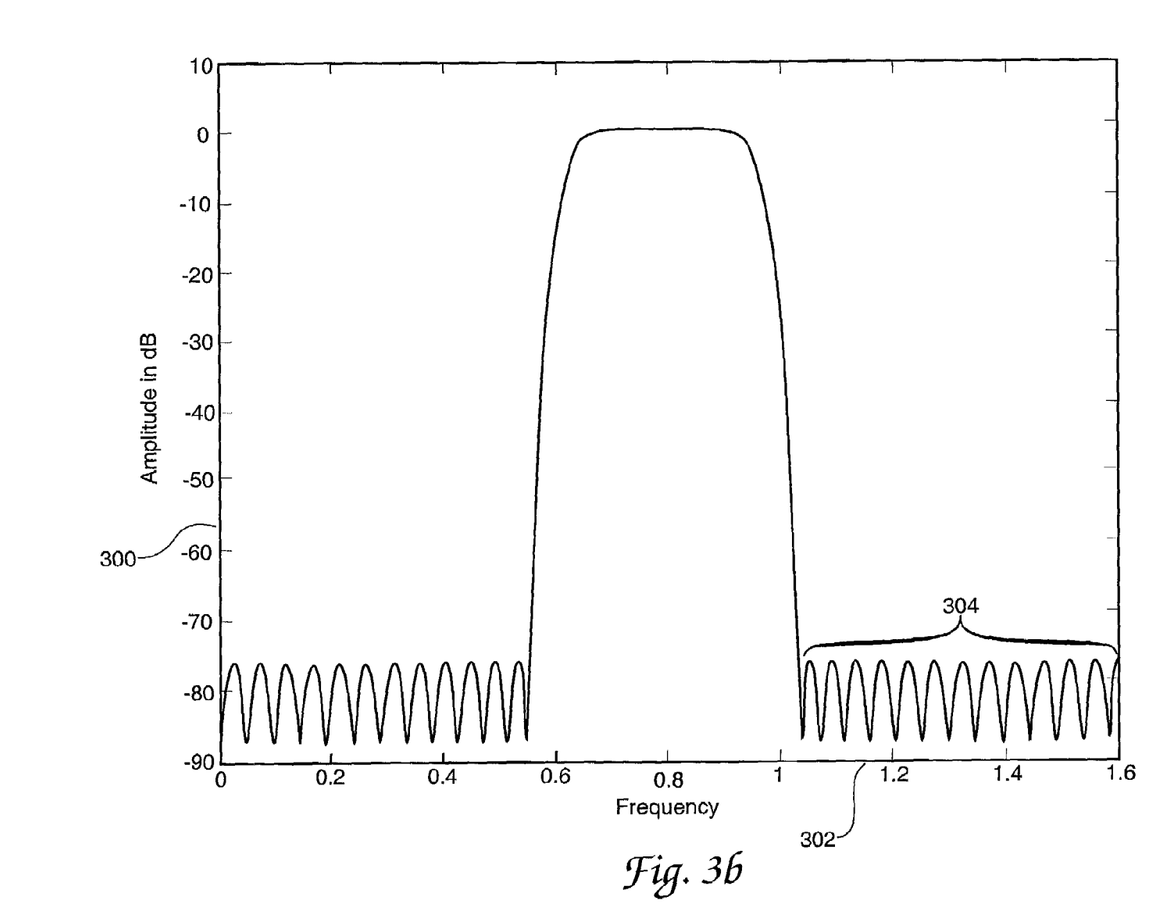
FIG. 3b shows a frequency domain response of a Parks-McClellan window.

To widen the individual filters and at the same time suppress the side lobes, a window (or weighting) function can be applied to the input data. There are many different window functions. The one used in the present example is the Parks-McClellan window because it can provide the desired frequency response. The relative amplitude of the window function is shown in FIGS. 3a and 3b. In FIGS. 3a and 3b, the y-axis represents amplitude, in FIG. 3a the x-axis represents time sample at 301 and in FIG. 3b the x-axis at 302 represents frequency. FIG. 3b shows the corresponding frequency domain response with very low pass band ripples at 304 and side lobes lower than 70 dB. This is a desirable filter shape.

The input data x(n) will be modified by the window function h(n). The resulting data $x_m(n)$ used as the input of the fast Fourier transform can be written as $$x_m(n) = x(n)h(n) \quad (11)$$

where n=0, 1, 2, ..., 255. As stated previously, the outputs are decimated by 8. Under this condition the modified data can be used in Equation (5) to find the y(n) as $$y(n) \sum_{m=0}^{7} x_m(n + 32m) = \sum_{m=0}^{7} x(n + 32m)h(n + 32m) \quad (12)$$

where n=0, 1, 2, ... (N/M)−1. A few y(n) terms are written as $$y(0) = x(0)h(0) + x(32)h(32) + \ldots + x(224)h(224)$$

$$y(1) = x(1)h(1) + x(33)h(33) + \ldots + x(225)h(225)$$

...

$$y(31) = x(31)h(31) + x(63)h(63) + \ldots + x(255)h(255) \quad (13)$$

If a 32-point fast Fourier transform is performed on these y(n) values, 16 individual filters will be generated. Each filter shape is as shown in FIG. 3b.

Now let us consider in more detail the process to generate the y(n) values. Each of these values can be generated from the convolution output of a filter with the input signal. The 256-point window function in the time domain can be written as $$h(n) = h(255)\delta(n) + h(254)\delta(n-1) + h(253)\delta(n-2) + \ldots + h(0)\delta(n-255) \quad (14)$$

where the δ function indicates the h(n) value occurs at time n. The impulse sequence of the filter is written in an inverse way. This impulse function can generate the results from Equation (13) through convolution with the input signal. Since the window function shown in FIG. 3a is symmetric in the time domain, this inverse is just a subscript change. The weighting function can be decimated by 32 and the results are 32 individual filters and each filter has eight taps. This filter decimation is often referred to as the polyphase filter. Each of the 32 filters has the response as indicated below.

$$h_0(n) = h(224)\delta(n) + h(192)\delta(n-1) + h(160)\delta(n-2) + \ldots + h(0)\delta(n-7)$$

$$h_1(n) = h(225)\delta(n) + h(193)\delta(n-1) + h(161)\delta(n-2) + \ldots + h(1)\delta(n-7)$$

...

$$h_{31}(n) = h(255)\delta(n) + h(223)\delta(n-1) + h(191)\delta(n-2) + \ldots + h(31)\delta(n-7) \quad (15)$$

These filters must convolve with the proper input data to obtain the result in Equation (13). In order to obtain the correct data format, the input data must be decimated by 32 also. When the decimated input signal and the decimated filter are convolved and reaching steady state, the output is equal to the result of Equation (13).

The next time the 32-point fast Fourier transform is performed, the input y(n) values to the fast Fourier transform are $$y(0)=x(32)h(0)+x(64)h(32)+ \ldots +x(256)h(224)$$

$$y(1)=x(33)h(1)+x(65)h(33)+ \ldots +x(257)h(225)$$

...

$$y(31)=x(63)h(31)+x(95)h(63)+ \ldots +x(287)h(255) \quad (16)$$

Figure 4:
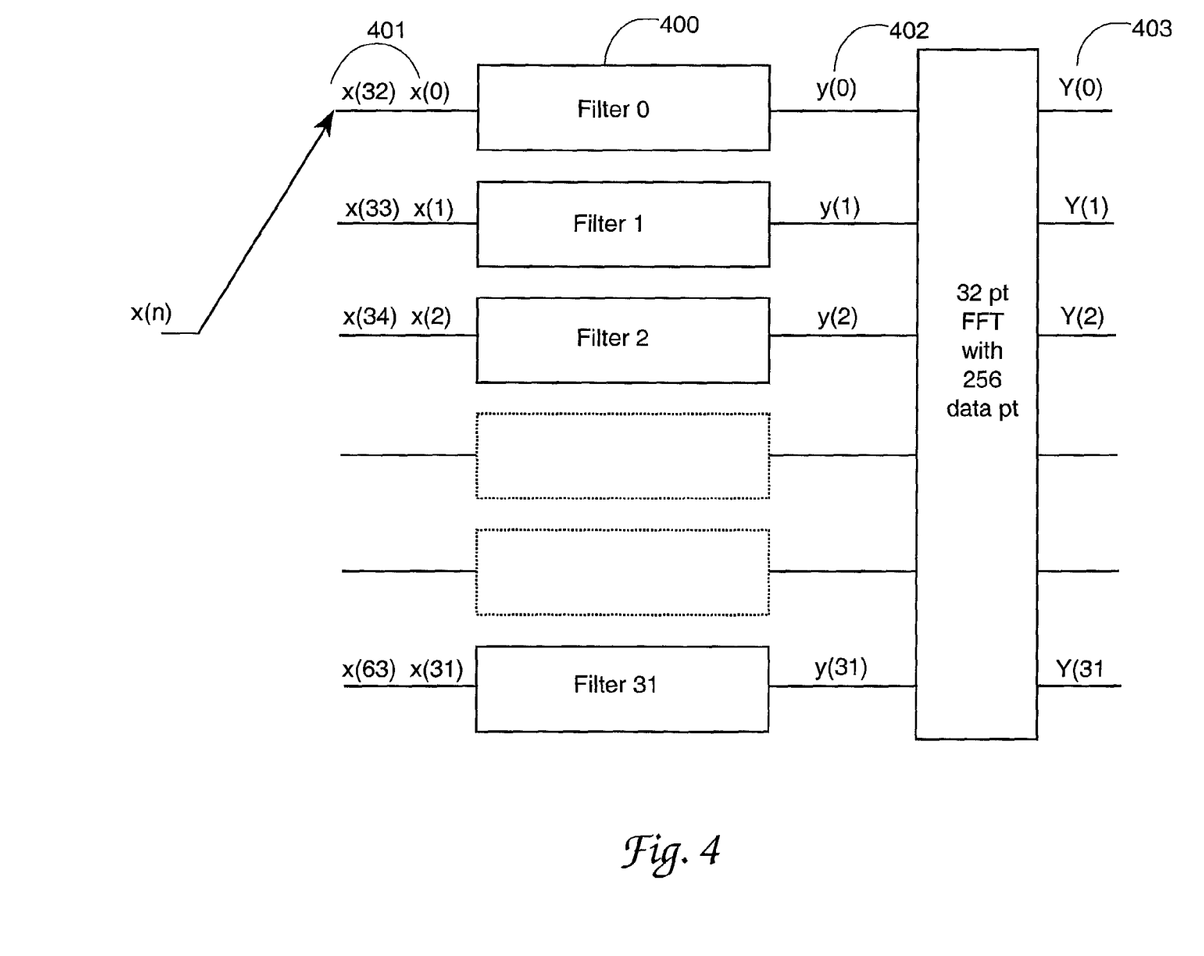
FIG. 4 shows a channelization approach according to the invention.

In Eq. 16, the first data point is x(32), thus, the input is shifted 32 points. The hardware to accomplish this goal is shown in FIG. 4. In FIG. 4, there are 32 filters, shown at 400 and each filter has 8 taps. Two cycles of input data are shown at 401 and each cycle contains 32 data points. The outputs at 402 are shown as y(n) and they are used as the input of the fast Fourier transform. The final results in the frequency domain at 403 are represented by Y(k). In this case the inputs are decimated by 32 and the final frequency domain also has 32 outputs. The input data are shifted 32 points, which is also the output frequency bin number. This case is referred to as the critically sampled case. A critically sampled case is that the number of output frequency bin equals to the input data shift. This means that the output sampling rate is 1/M times the input sampling rate where M is the number of input data point shifted.

Figure 5:
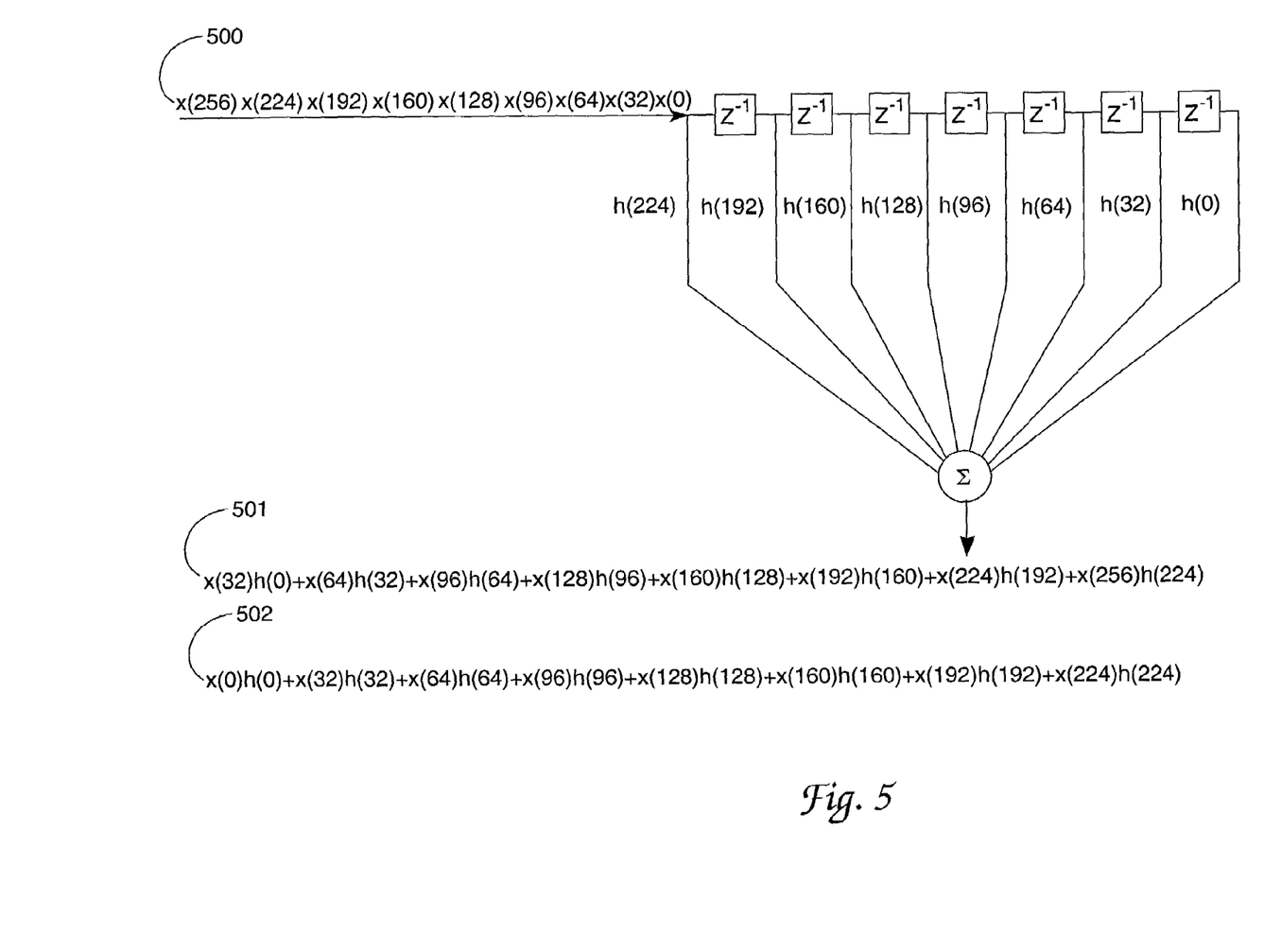
FIG. 5 shows an individual polyphase filter according to the invention.

Each individual filter in FIG. 4 is a finite impulse response (FIR) filter. Filter number 0 with y(0) is shown in FIG. 5. In FIG. 5, the decimated input data points are shown at 500. When the input signal reaches steady state, the output of the filter contains 8 terms. The first and second consecutive filter outputs after steady state are also listed and shown at 501 and 502. The lower line 502 represents the first output, which matches the y(0) output of Equation (13). The upper line 501 represents the second time output where the input data are shifted by 32 points. This result match the y(0) output from Equation (16). The rest of the filter outputs can be obtained in a similar manner.

Figure 6:
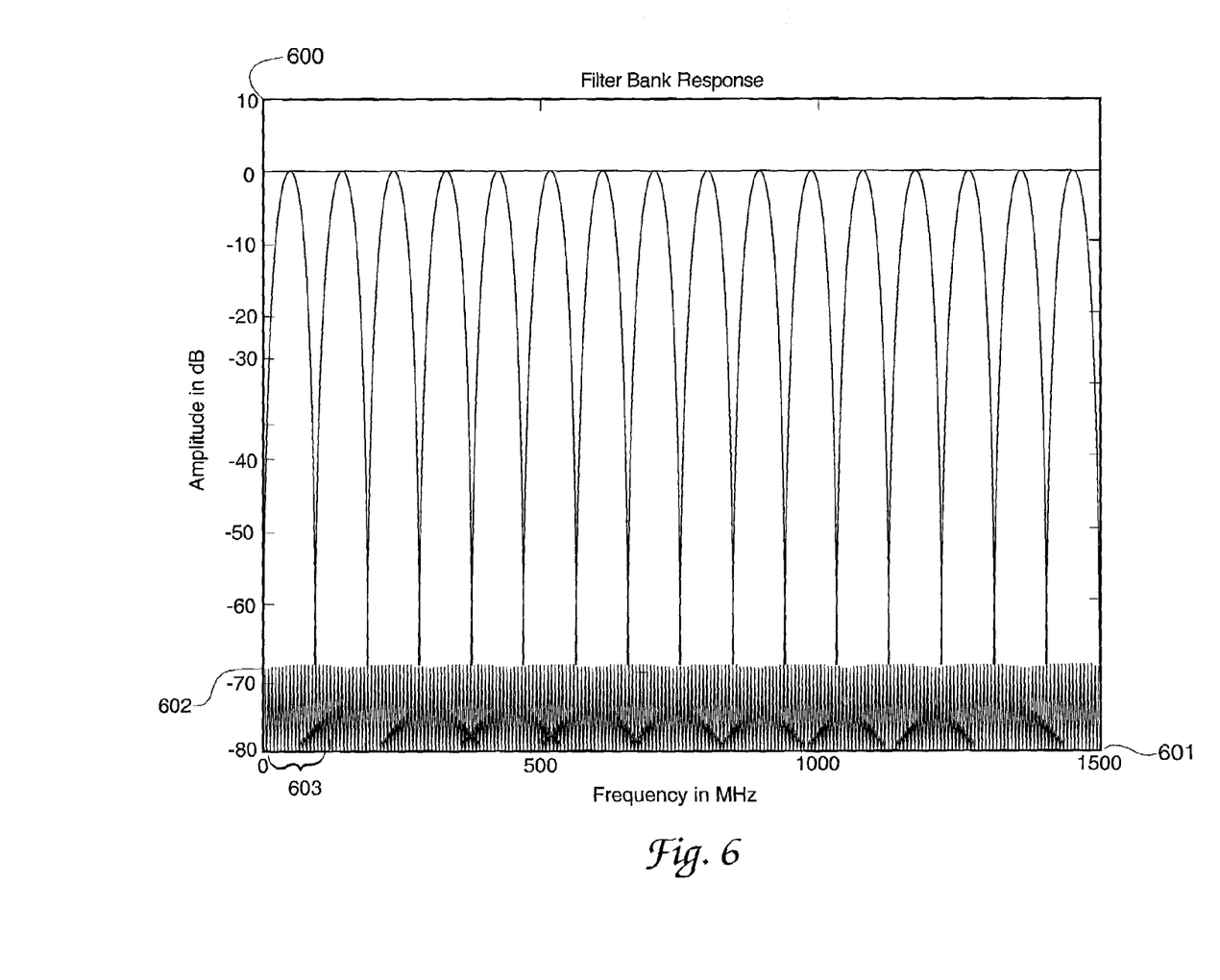
FIG. 6 shows a designed filter bank according to the invention.

The shape of the filter bank is shown in FIG. 6. This filter bank has a dynamic range of close to 75 dB, shown at 602, with a bandwidth of about 93.75 MHz, one of which is shown at 603. In these wide band filters, simultaneous signals should also be considered since the probability of two signals falling into one channel is high.

Figure 7:
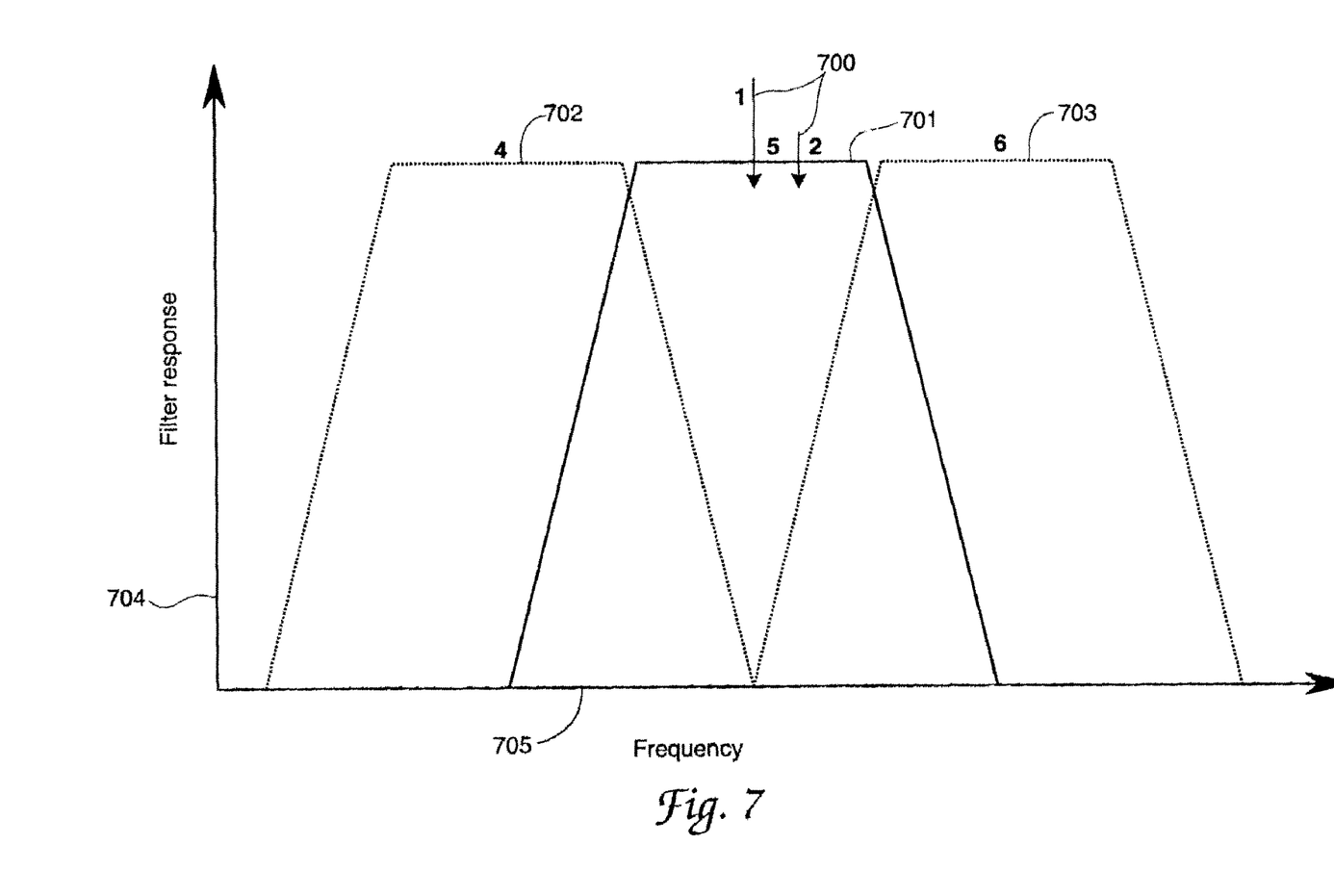
FIG. 7 shows two signals in one channel according to the invention.

To improve the single signal frequency resolution, a phase comparator is used at every output. For example, there are two signals and both are in channel 5 as shown in FIG. 7 at 700, with channel 5 shown at 701. In the graph of FIG. 7, the y-axis at 704 shows the filter response and the x-axis at 705 represents the frequency. Signal 1 is close to channel 4 shown at 702 and signal 2 is close to channel 6 shown at 703. The signals are separated by ¼ of the channel width and signal 1 is 20 dB stronger than signal 2. The three phase comparators are used to measure the two output frequencies. Phase comparator in channel 4 measures the frequency of signal 1 and phase comparator in channel 6 measures the frequency of signal 2. Channel 5 contains both signals and it is difficult to measure them in one channel. In this design, channels 4 and 6, represented at 702 and 703, respectively, can measure the two frequencies, thus, it is not necessary to obtain the frequency from channel 5. It is desirable to process two signals in one channel by one processor rather than three. The present invention can accomplish this goal.

SUMMARY OF THE INVENTION

The present invention uses narrow-band monobit receivers after a digital filter bank to separate simultaneous signals in one channel. Placing the monobit receiver at the filter outputs improves receiver performance.

DETAILED DESCRIPTION

The present invention uses narrow-band monobit receivers after a digital filter bank to separate simultaneous signals in one channel. The invention improves the capability of wideband digital receivers.

One important factor in building this receiver is the bandwidth of the monobit receiver. In order to process signals falling between channels, the monobit receiver should have a bandwidth wider than 93.75 MHz. One simple approach to increase the bandwidth is to double it to 187.5 MHz, which can be accomplished by doubling the output sampling frequency.

The relation between[1]

$$K=MI \quad (17)$$

where K is the output frequency bins, M is the number of data points shifting per fast Fourier transform operation and I is an integer, which is referred to as the over sampling ratio. In this discussion K=32, M=16 and I=2.

When the filter reaches steady state, the input to the fast Fourier transform operator is the same as Equation (13). However, the second cycle of the fast Fourier transform operates, the input is different from the result of Equation (16), the desired results are $$y(0)=x(16)h(0)+x(48)h(32)+\ldots+x(240)h(224)$$

$$y(1)=x(17)h(1)+x(49)h(33)+\ldots+x(241)h(225)$$

$$\ldots$$

$$y(31)=x(47)h(31)+x(79)h(63)+\ldots+x(287)h(255) \qquad (18)$$

Figure 8:
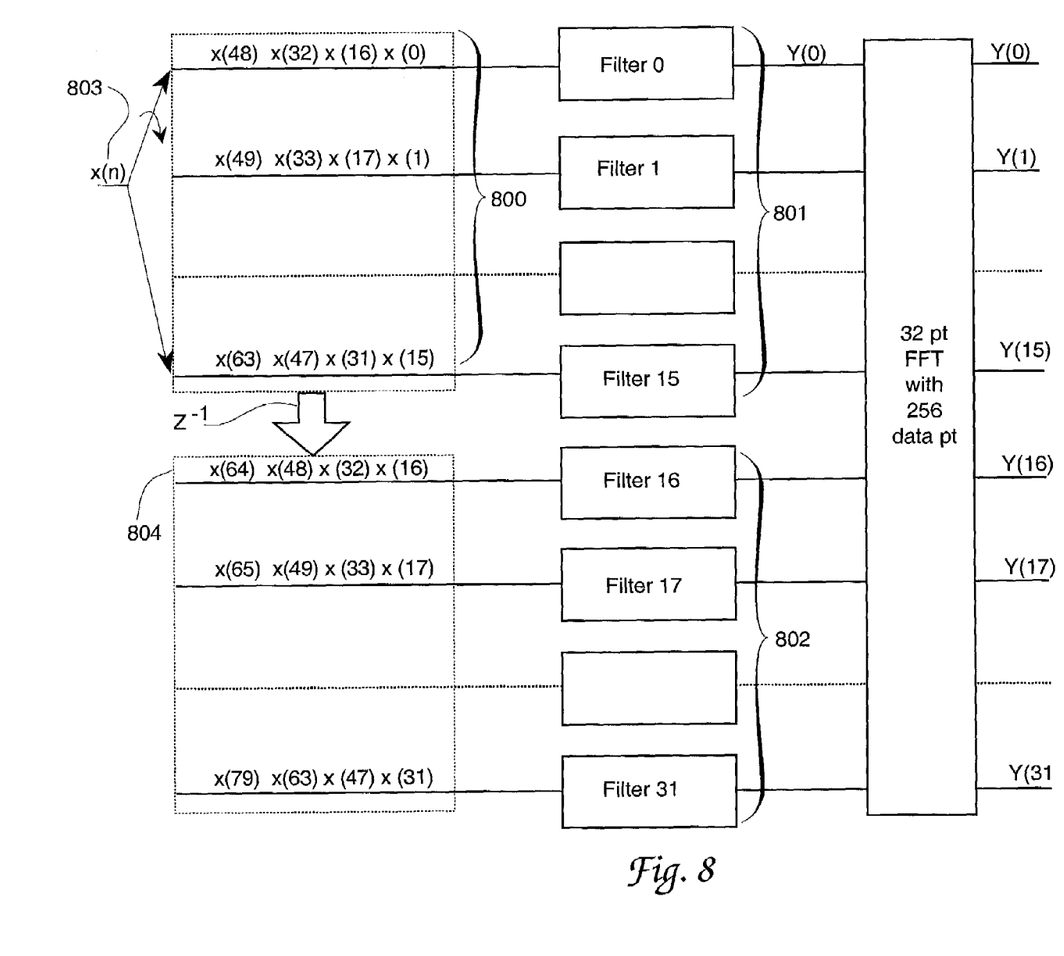
FIG. 8 shows an arrangement of over sampling by 2 according to the invention.

The output starts from x(16) instead of starting from x(32). This discussion is similar to the discussion in reference 2. FIG. 8 shows that the input at 803 is decimated into 16 outputs, shown at 800, rather than 32. These 16 inputs, represented at 800, are fed into filters 0 to 15, represented at 801. The inputs to filters 16 to 31 are represented at 802 and are obtained from delaying the first 16 outputs by one clock cycle. Some of the inputs are listed in this figure. For example, the input to filter 16 is obtained by delaying input to filter 0 by one clock cycle, thus, this input is x(16) x(32) . . . , represented at 804. Since the input is decimated by 16, comparing with the case decimated by 32, the output speed is doubled.

Figure 9:
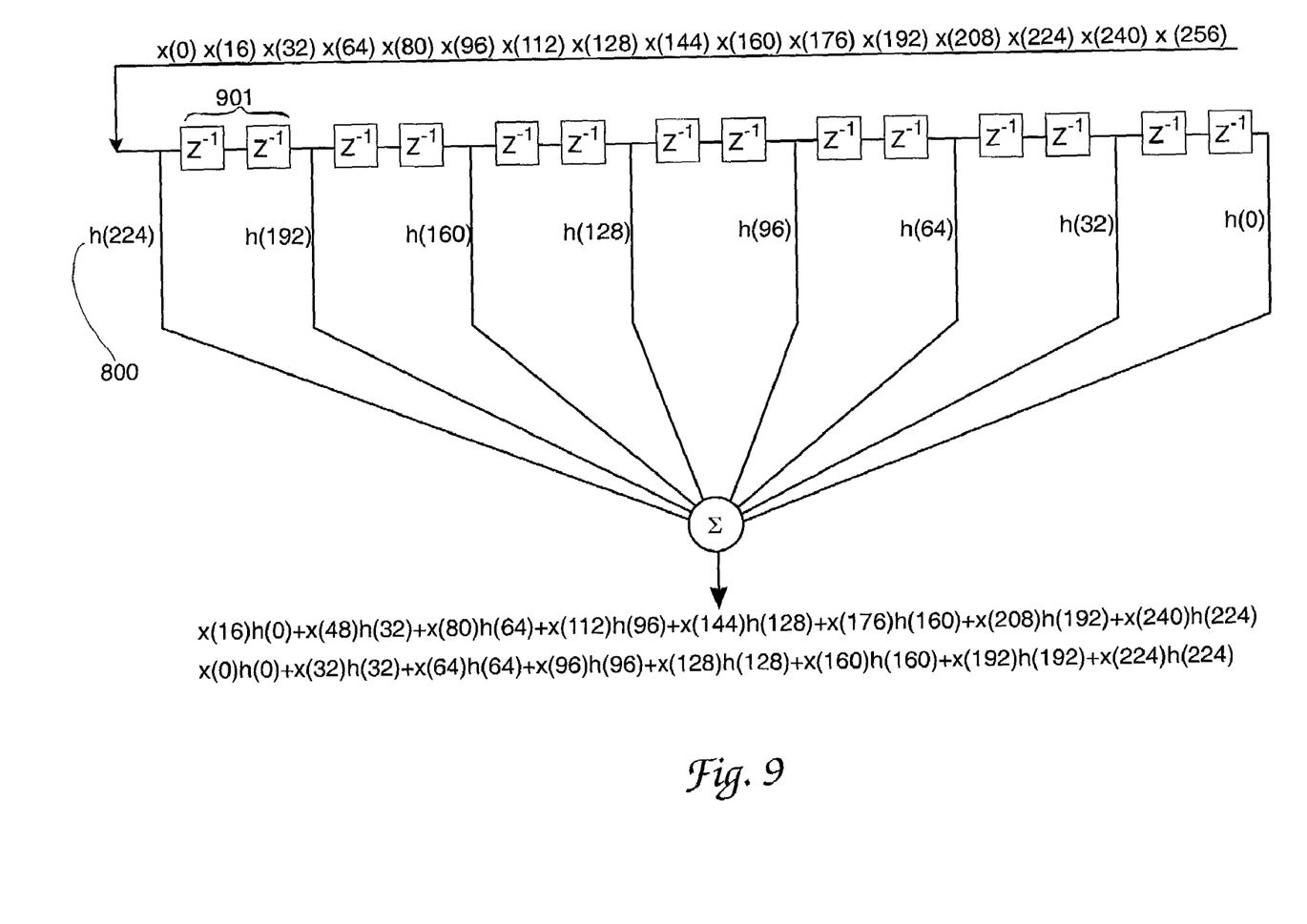
FIG. 9 shows a modified filter structure according to the invention.

As shown in FIG. 9, the filters in FIG. 8 are also modified. Between each output, represented by the line at 800, there are two delay cycles, two of which are shown at 901, rather than one. The first two consecutive outputs are shown and they match the result of the first equation in Eq. 13 and Eq. 18. From this arrangement one can see that the output rate to generate Y(k) from the fast Fourier transform is doubled. The output-sampling rate is 187.5 MHz. This is the input rate to the monobit receiver. Since the outputs from the fast Fourier transform are complex, the monobit receiver has a bandwidth of 187.5 MHz, which is double the 3 dB bandwidth of the output filter.

Figure 10:
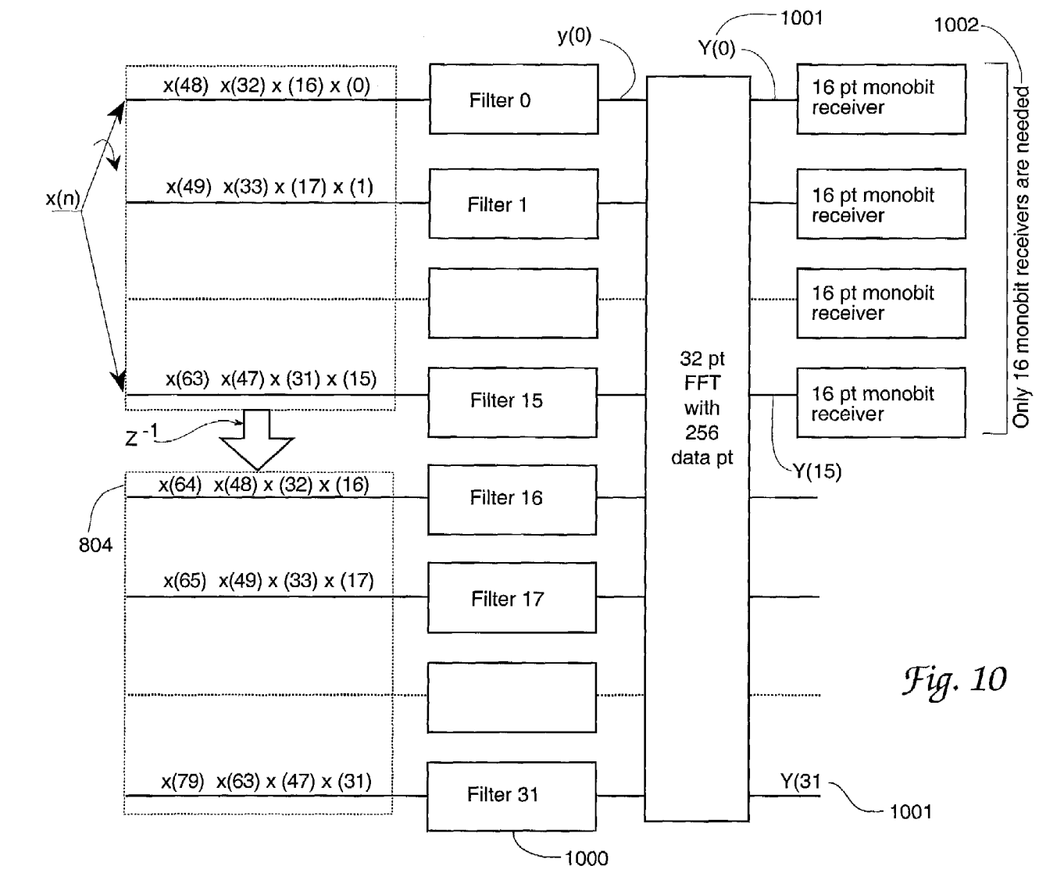
FIG. 10 shows over sampling filters followed by monobit receivers according to the invention.

A simulation demonstrates operational performance of the digital filter followed by monobit receivers arrangement of the present invention. The digital filters are generated through fast Fourier transform operation. The filter shape is the same as shown in FIG. 6. The only difference is the output rate is doubled because each fast Fourier transform is performed by shifting the input 16 points rather than 32 points. However, the sampling rate is not shown in FIG. 6. A threshold should be placed at the outputs of each filter. If the output is lower than the threshold, one should consider that there is no signal output from this channel and its output will not be processed. One possible arrangement is shown in FIG. 10. In FIG. 10, the threshold at the outputs of the filters, the filters being shown at 1000, are not shown. Although the 32-point fast Fourier transform generates 32 outputs, shown at 1001, only 16 of them carry independent information, thus only 16 narrow-band monobit receivers are needed, represented at 1002.

The channels with signals are processed with the monobit receivers. Only the highest two bits from the real and imaginary parts are used as the input of the monobit receiver. This operation should be equivalent to putting a limiting amplifier at the filter output, although a real limiting amplifier cannot operate on complex signals. This limiting action destroys the amplitude information on the input signals, thus, a threshold is needed at the channel output as discussed in the previous paragraph. In the time domain every 16 outputs from a certain frequency bin are used as one input frame of the monobit receiver. Since the output-sampling rate is 187.5 MHz, the time to collect 16 samples is about 85 ns ($16/187.5\times10^6$). This is the same time to collect 256 input data points because $256/3\times10^9$ also equal to 85 ns. Thus, both the digital filter and the monobit receiver process 256 input data points. Since there are only 16 inputs to a monobit receiver the design can be very simple. There are 16 outputs because the inputs are complex. These 16 outputs cover a bandwidth of 187.5 MHz thus, each individual output of the monobit receiver is about 11.72 MHz (187.5/16). This implies that the receiver can separate two signals separated by about 12 MHz. However, if the amplitudes of the two signals from a wide-band digital filter are separated more the 5 dB, the receiver will miss the weak signal.

Figure 11A:
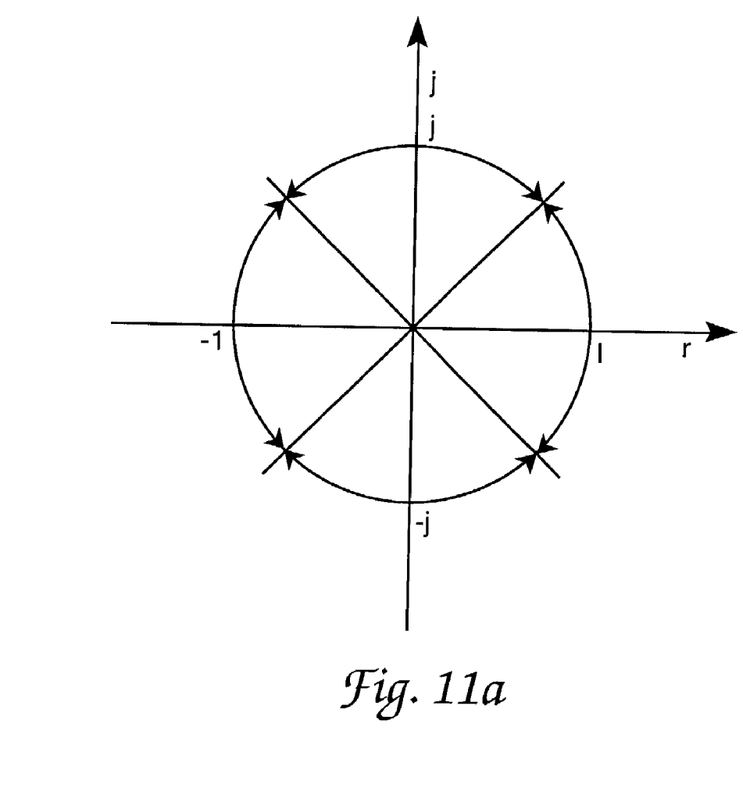
FIG. 11a shows a four-point kernel function arrangement of the invention.
Figure 11B:
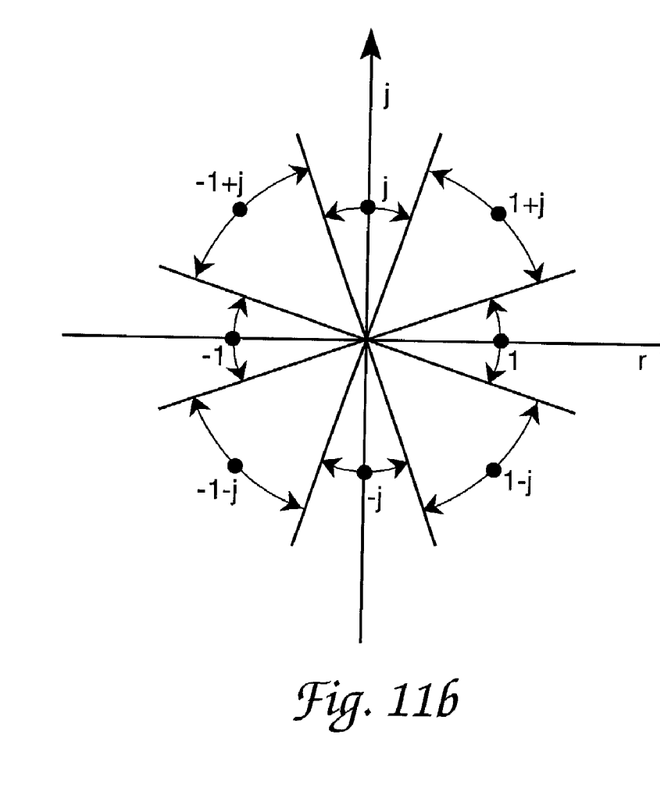
FIG. 11b shows an eight-point kernel function arrangement of the invention.

Since the fast Fourier transform operation only takes 16 input points, both the Kernel functions in FIGS. 11a and 11b are used in the simulation. Although two signals in one channel are shown in both approaches, the eight-point Kernel function provides a better result, which means higher instantaneous dynamic range. The monobit receiver limits the instantaneous dynamic range, thus, two signals in one channel must have comparable amplitudes to be detected by the receiver. The instantaneous dynamic range of two signals in different channels is determined by the shape of the digital filter. In this simulation the threshold is not included. In order to integrate the monobit receiver, a practical configuration and more thorough simulation are needed.

Figure 12:
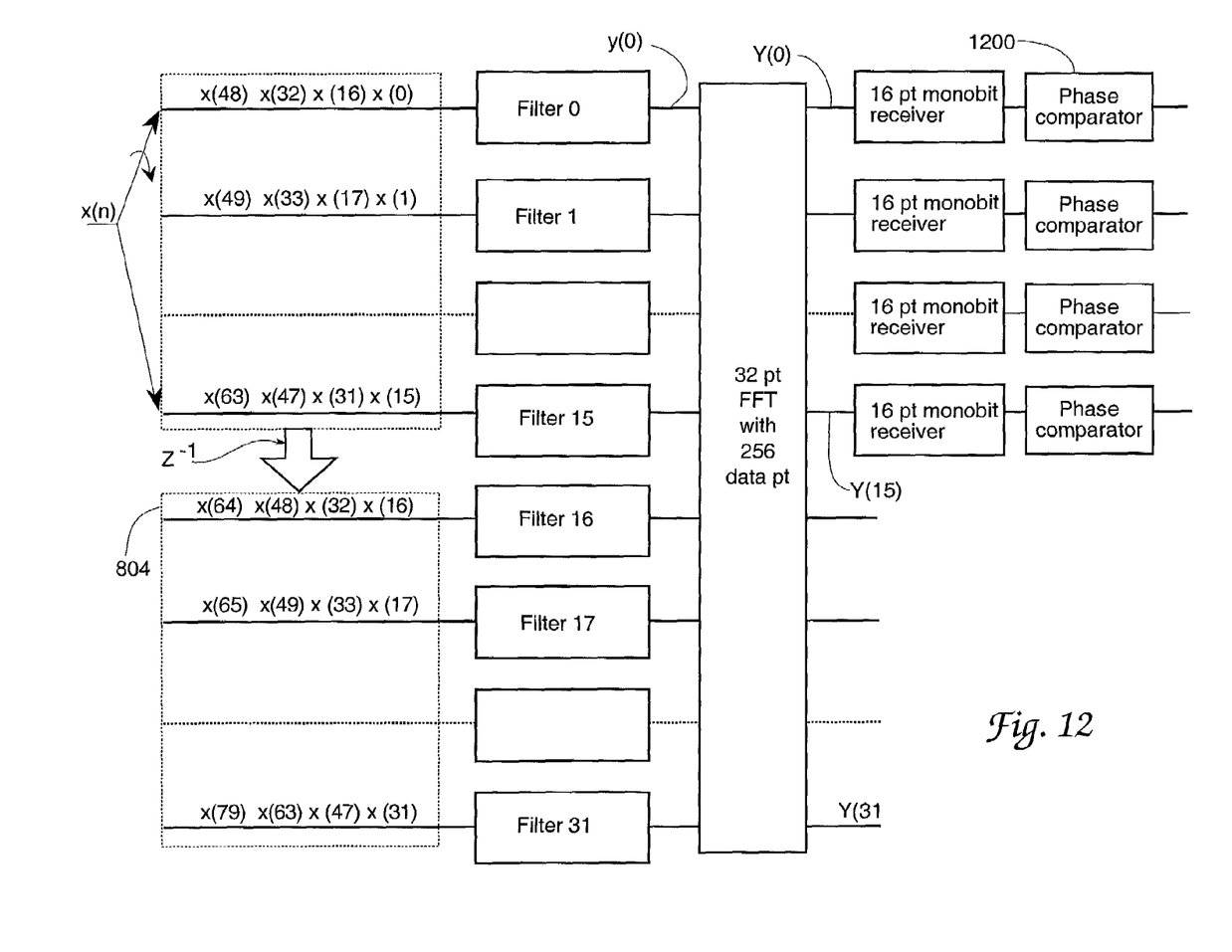
FIG. 12 shows a digital filter bank followed by monobit receivers and phase comparators.

In the above example, each channel has a width of 11.72 MHz. These bandwidths are narrow enough to separate two simultaneous signals, but not fine enough to report a frequency reading. It is desirable to have the capability to report a finer frequency reading. The finer frequency reading can be obtained by using a phase comparator after the monobit receiver. FIG. 12 shows such an arrangement.

Using this approach a single frequency resolution of about 0.5 MHz should be achievable. In order to obtain this resolution the pulse width must increase to a minimum of 512 data points at the input of the receiver, which is about 171 ns.

While the apparatus and method herein described constitute a preferred embodiment of the invention, it is to be understood that the invention is not limited to this precise form of apparatus or method and that changes may be made therein without departing from the scope of the invention, which is defined in the appended claims.

We claim:

1. A digital receiving device capable of separating simultaneous signals in a single channel, comprising:
   digital signal receiving means;
   means for performing a first fast Fourier transform on a digital signal;
   means for performing a second fast Fourier transform on an output from said first fast Fourier transform;
   a digital filter bank receiving output from said second fast Fourier transform;
   clock cycle delaying means for delaying the digital filter bank output;
   eliminating the digital filter bank output by comparing to a preselected threshold; and
   a plurality of narrow-band monobit receivers for receiving signals output from said digital filter bank and of a greater value than said preselected threshold and further, said plurality of narrow-band receivers receiving only the highest two bits from real and imaginary parts of said signal output from said digital filter bank and of a greater value than said signal eliminating threshold.

2. The digital receiving device of claim 1 wherein a bandwidth of said plurality of narrow-band monobit receivers is wider than 93.75 MHz.

3. The digital receiving device of claim 1 wherein said digital receiving device can separate two signals separated by 12 MHz.

4. The digital receiving device of claim 1 wherein the monobit receivers receives 16 complex inputs and processing 16 outputs covering a bandwidth of 187.5 MHz with each individual output covering a bandwidth of 11.72 MHz.

5. The digital receiving device of claim 1 wherein said clock cycle delaying means for delaying the digital filter bank output further comprises two delay lines between each filter output.

6. The digital receiving device of claim 1 wherein the digital filter output signal sampling rate is 187.5 MHz.

7. The digital receiving device of claim 1 wherein the monobit receivers have a bandwidth of 187.5 MHz.

8. The digital receiving device of claim 1 wherein said plurality of narrow-band monobit receivers comprises 16 narrow-band monobit receivers.

9. The digital receiving device of claim 1 further comprising a phase comparator after said plurality of narrow-band monobit receivers for a finer frequency reading.

10. The digital receiving device of claim 1 wherein said means for performing a second fast Fourier transform on an output from said first fast Fourier transform comprises a monobit receiver.

11. A digital receiving device capable of separating two signals separated by 12 MHz comprising:
   digital signal receiving means;
   means for performing a first fast Fourier transform on a digital signal;
   means for performing a second fast Fourier transform on an output from said first fast Fourier transform;
   a digital filter bank receiving output from said second fast Fourier transform;
   a digital filter bank output clock cycle delaying means comprising two delay lines between each filter output for delaying the digital filter bank output;
   means for eliminating the digital filter bank output by comparing to a pre-selected threshold;
   a plurality of narrow-band monobit receivers for receiving signals output from said digital filter bank and of a greater value than said pre-selected threshold, said plurality of narrow-band receivers receiving only the highest two bits from real and imaginary parts of the signal output from said digital filter bank and of a greater value than said pre-selected-threshold and wherein the monobit receivers receive 16 complex inputs and processing 16 outputs covering a bandwidth of 187.5 MHz with each individual output covering a bandwidth of 11.72 MHz; and
   a phase comparator receiving output from said plurality of narrow-band monobit receivers for a finer frequency reading.

12. A digital signal receiving method capable of separating simultaneous signals in a single channel, comprising the steps of:
   receiving a digital signal;
   performing a first fast Fourier transform on said digital signal;
   performing a second fast Fourier transform on an output from said first fast Fourier transform;
   receiving output from said second fast Fourier transform into a digital filter bank;
   delaying digital filter bank output;
   eliminating a digital filter bank output signal based on a preselected threshold; and
   receiving signals output from said digital filter bank through a plurality of narrow-band monobit receivers of a greater value than said pre-selected threshold, said plurality of narrow-band monobit receivers receiving only the highest two bits from real and imaginary parts of the signal output from said digital filter bank and of a greater value than said pre-selected threshold.

13. The digital signal receiving method of claim 12 wherein said step of receiving signals output from said digital filter bank further comprises receiving signals output from said digital filter bank through a plurality of narrow-band monobit receivers having a bandwidth wider than 93.75 MHz.

14. The digital signal receiving method of claim 12 wherein said digital receiving method separates two signals separated by 12 MHz.

15. The digital signal receiving method of claim 12 wherein said step of receiving signals output from said digital filter bank through a plurality of narrow-band monobit receivers further comprises the step of receiving signals having 16 complex inputs and processing 16 outputs covering a bandwidth of 187.5 MHz, with each individual output covering a bandwidth of 11.72 MHz output from said digital filter bank through said plurality of narrow-band monobit receivers.

16. The digital signal receiving method of claim 12 wherein said delaying step further comprises the step of delaying the digital filter bank output cycle clock with two delay lines between each filter output.

17. The digital signal receiving method of claim 12 wherein said step of receiving signals output from said digital filter bank further comprises receiving signals output from said digital filter bank through 16 narrow-band monobit receivers.

18. The digital signal receiving method of claim 12 further comprising the step of comparing the phase of the output of said plurality of narrow-band monobit receivers for a finer frequency reading.

* * * * *